United States Patent
McConnell

(10) Patent No.: US 7,986,044 B2
(45) Date of Patent: Jul. 26, 2011

(54) SIGNAL TRANSMISSION ARRANGEMENT AND METHOD

(75) Inventor: Roderick McConnell, Munich (DE)

(73) Assignee: Infineon Technologies AG, Munich (DE)

( * ) Notice: Subject to any disclaimer, the term of this patent is extended or adjusted under 35 U.S.C. 154(b) by 1139 days.

(21) Appl. No.: 11/360,982

(22) Filed: Feb. 23, 2006

(65) Prior Publication Data

US 2006/0211380 A1 Sep. 21, 2006

(30) Foreign Application Priority Data

Feb. 23, 2005 (DE) .......................... 10 2005 008 322

(51) Int. Cl.
*H01L 23/48* (2006.01)
(52) U.S. Cl. . 257/777; 257/691; 257/690; 257/E25.013; 257/E23.079
(58) Field of Classification Search .................. 257/690, 257/691, 723, 777, E23.079, E25.013
See application file for complete search history.

(56) References Cited

U.S. PATENT DOCUMENTS

| 4,697,095 | A | * | 9/1987 | Fujii ............................ 327/408 |
| 5,473,635 | A | | 12/1995 | Chevroulet |
| 5,903,607 | A | | 5/1999 | Tailliet |
| 6,005,477 | A | | 12/1999 | Deck et al. |
| 6,936,914 | B2 | * | 8/2005 | Shinomiya .................... 257/691 |
| 7,106,600 | B2 | * | 9/2006 | Kupla et al. .................. 361/783 |

FOREIGN PATENT DOCUMENTS

| DE | 197 16 011 A1 | 10/1998 |
| DE | 103 15 303 A1 | 11/2004 |
| DE | 10 2004 010 852 A1 | 11/2005 |

\* cited by examiner

*Primary Examiner* — Matthew C Landau
*Assistant Examiner* — Jessica Hall
(74) *Attorney, Agent, or Firm* — Maginot, Moore & Beck

(57) ABSTRACT

Data signals are transmitted between a number of semiconductor chips which are connected to one another in a common chip package. For that a signal transmission arrangement is set up for a transmission of the signals via in each case one transmitting/receiving interface which is arranged at the chip ends of a power supply connection which connects the number of semiconductor chips.

20 Claims, 2 Drawing Sheets

SIGNAL TRANSMISSION ARRANGEMENT AND METHOD

BACKGROUND

The invention relates to a signal transmission arrangement and a corresponding signal transmission method for the transmission of data signals between a number of semiconductor chips which are connected to one another in a common package.

With the continuing trend towards minimization of integrated semiconductor circuits, a number of semiconductor chips of the same or different function are frequently accommodated in a single package and are connected to one another therein by means of connecting lines. An example of such chips with different function, connected to one another by connecting lines in a common package, is represented by a memory chip embedded in a logic chip, where the logic chip can be constructed e.g. as an application specific integrated circuit (ASIC). To transmit data, address and control signals, a relatively large number of signal transmission lines or channels must be run between the logic chip acting as master and the memory chip, here designated as slave, in conventional technology. Each of these signal lines requires an interface including a connecting pad on both chips. Such connecting pads reduce the available chip area. This is all the more important the smaller the memory chip acting as slave is, for example. For this reason, a great reduction in the number of physical connections between the master chip and the slave chip is desirable.

To reduce the physical connections, instead of a parallel signal transmission, a serial signal transmission has hitherto been proposed which reduces the chip area necessary for the signal transmission interface including the connecting pads.

Indispensable connections which are always present are the power supply connections, e.g. lines which connect the chips with one another which are located in a package. The inventor has recognized that the number of physical connecting lines necessary for the signal transmission can be reduced even further if the power supply connections are simultaneously also used for the signal transmission.

SUMMARY

It is thus an advantage of the invention to specify a signal transmission arrangement and a signal transmission method for the transmission of data signals between a number of semiconductor chips connected to one another in a common package, such that the number of physical transmission connections needed for the signal transmission, and thus the chip area necessary for the interface circuits and the connecting pads, can be drastically reduced.

As disclosed herein, a signal transmission is set up for a transmission of the signals via at least one transmitting/receiving interface which is in each case arranged at the chip ends of at least one power supply connection which connects the number of semiconductor chips.

Such a power supply connection can be constructed with conventional metallic lines or also with conductive material such as e.g. conductive adhesive.

According to a preferred first exemplary embodiment, the signal transmission arrangement according to the invention is set up for signal transmission between a master chip and at least one slave chip.

According to an alternative second exemplary embodiment, the signal transmission arrangement according to the invention can be set up for signal transmission between a number of functionally equivalent semiconductor chips.

In both the first and in the second exemplary embodiments, the respective transmitting/receiving interfaces can be set up for serial signal transmission.

Furthermore, the transmitting/receiving interfaces can be set up for a signal transmission via a number of parallel channels while simultaneously using a corresponding number of power supply connections between the semiconductor chips.

Depending in each case on the specifications of the power supply connection, the current, voltage and impedance values thereof, the rate of the transmitted signals and further characteristics of the semiconductor chips connected to one another, the transmitting/receiving interfaces, according to an exemplary embodiment, can be set up for differential signal transmission e.g. via two power supply connections with isolated potentials.

The transmitting/receiving interfaces can be set up, on the one hand, for unidirectional signal transmission, but also for bi-directional signal transmission via the at least one power supply connection.

The transmitting/receiving interfaces can have at least one transmitting circuit which triggers small voltage fluctuations on the power supply line which correspond to the signals to be transmitted.

For receiving the signals, the transmitting/receiving interfaces have at least one receiver circuit which is set up for distinguishing small voltage fluctuations on the at least one power supply line as the transmitted signals.

Another advantage of the invention is to provide a method for the transmission of data signals between a number of semiconductor chips which are connected to one another in a common package. The method according to the invention includes the following steps: providing signal transmission transmitting/receiving interfaces in each case at the chip ends of at least one power supply line which connects the number of semiconductor chips and transmitting the signals by means of the transmitting/receiving interfaces via the associated power supply line.

BRIEF DESCRIPTION OF THE DRAWINGS

The above and further aspects and advantageous features of a signal transmission arrangement according to the invention and of a signal transmission method according to the invention will be explained in greater detail by means of exemplary embodiments, referred to the attached drawing, the figures of which show, in detail:

FIG. 3B—a second exemplary embodiment of transmitting/receiving interfaces for a bi-directional transmission of signals via a power supply line between at least two semiconductor chips, and FIG. 3C—a third exemplary embodiment of transmitting/receiving interfaces for a unidirectional transmission of signals via a power supply line between at least two semiconductor chips.

DESCRIPTION

Figure 1:
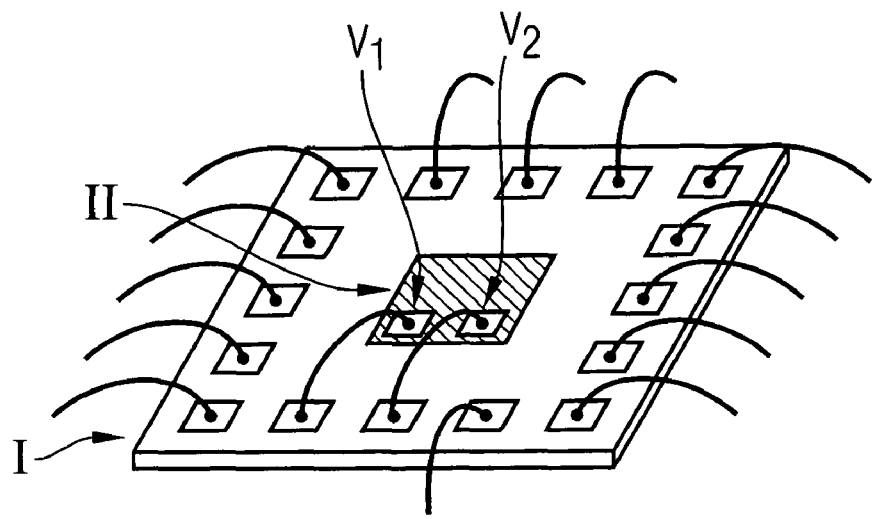
FIG. 1—a first preferred exemplary embodiment of a signal transmission arrangement according to the invention, in which signals can be transmitted via power supply lines between a master chip constructed as a logic chip and a slave chip embedded in the master chip as a memory chip.

In the first preferred exemplary embodiment of the signal transmission arrangement according to the invention, shown in perspective representation in FIG. 1, a first logic chip I, called master in the text which follows, and a second memory chip II, called slave in the text which follows, which is embedded in said first logic chip I are connected to one another via a number of power supply lines, of which FIG. 1 shows by way of example two power supply lines V1 and V2 which in each case supply e.g. a first voltage VSS and a second voltage VDD. The invention proposes to use these power supply lines V1, V2 for the transmission of signals, particularly data signals between the first and second semiconductor chips I and II and for this purpose to provide in each chip a transmitting/receiving interface, set up for the signal transmission, which are in each case connected to the chip ends of each power supply line V1, V2. It must be noted that, in the exemplary embodiments, the power supply connections which are used for the signal transmission are described, and shown in the figures of the drawing, as connecting lines, particularly as a metal wire connection. However, this is not intended to be restrictive. Other conducting connections, e.g. of conductive adhesive, can also be used in the sense of the invention.

FIG. 1 does not show the nature of these transmitting/receiving interfaces but they can be preferably set up for generating or for distinguishing slight voltage variations in the supply voltage. It is possible, with this design of the signal transmission proposed according to the invention, to drastically reduce the number of the physical transmission lines necessary for the signal transmission between the first semiconductor chip I and the second semiconductor chip II, to two in the example shown. Such a signal transmission arrangement can be used to construct e.g. a unidirectional or also bi-directional signal transmission between the transmitting/receiving interfaces via two power supply lines V1, V2 which are isolated from one another in terms of potential. The arrangement according to the invention can also be used for designing a differential signal transmission or each of the two power supply lines V1, V2 provided for the signal transmission can be allocated to a separate channel for serial signal transmission.

Figure 2:
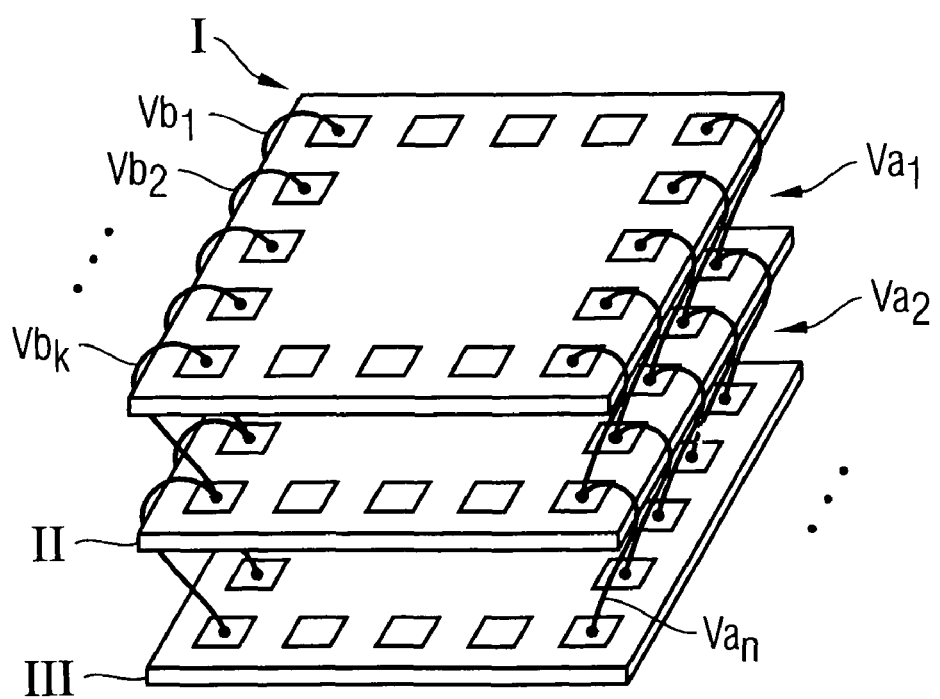
FIG. 2—a second exemplary embodiment of a signal transmission arrangement according to the invention, in which a number of power supply lines which run between a number of functionally equivalent semiconductor chips are used for the signal transmission.

FIG. 2 shows diagrammatically and in perspective a second exemplary embodiment of a signal transmission arrangement according to the invention, wherein three individual semiconductor chips I, II and III, which are connected to one another in a package (not shown) and are functionally equivalent, are connected to one another by more than two power supply lines Va1, Va2, . . . , Van and Vb1, Vb2 and Vbk which are used for parallel signal transmission.

Such a signal transmission arrangement as in FIG. 2 is excellently suitable for parallel signal transmission via the power supply lines Va1, Va2, . . . , Van and Vb1, Vb2, . . . , Vbk which are used simultaneously. Such parallel signal transmission can be unidirectional or bi-directional.

As mentioned, the respective case of application, that is to say the respective logic types of the semiconductor chips, the current/voltage and impedance characteristics of the respective power supply line and naturally their polarity, the rate of the transmitted signals and the signal direction, such as unidirectional or bi-directional, must be taken into consideration for the specific design of the transmitting/receiving interfaces at the chip ends of each of the power supply lines used for the signal transmission.

It is also essential for the choice of transmitting/receiving interfaces, whether a differential, pseudo-differential or non-differential signal transmission is performed.

Accordingly, a wide range of solutions is possible for implementing transmitting/receiving interfaces suitable for the present signal transmission arrangement while taking into consideration the above-mentioned criteria.

Figure 3A:
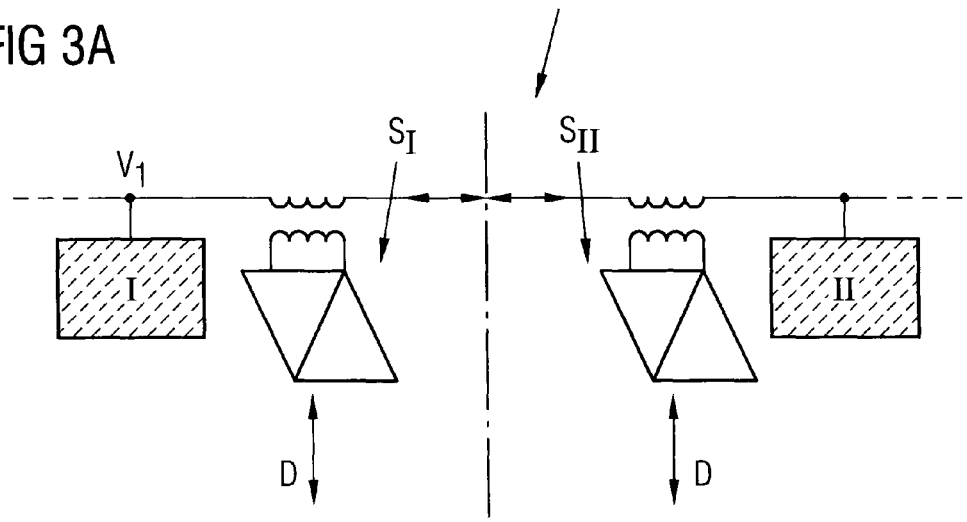
FIG. 3A—a first exemplary embodiment of transmitting/receiving interfaces for a bi-directional transmission of signals via a power supply line between at least two semiconductor chips.
Figure 3B:
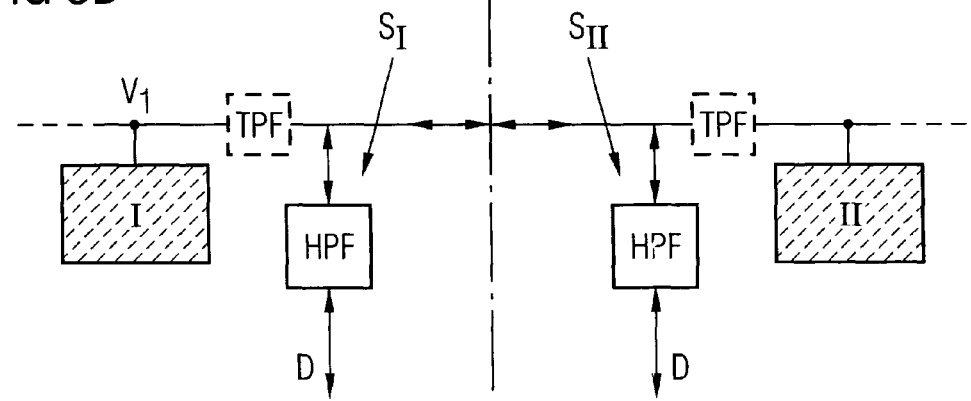
Figure 3C:
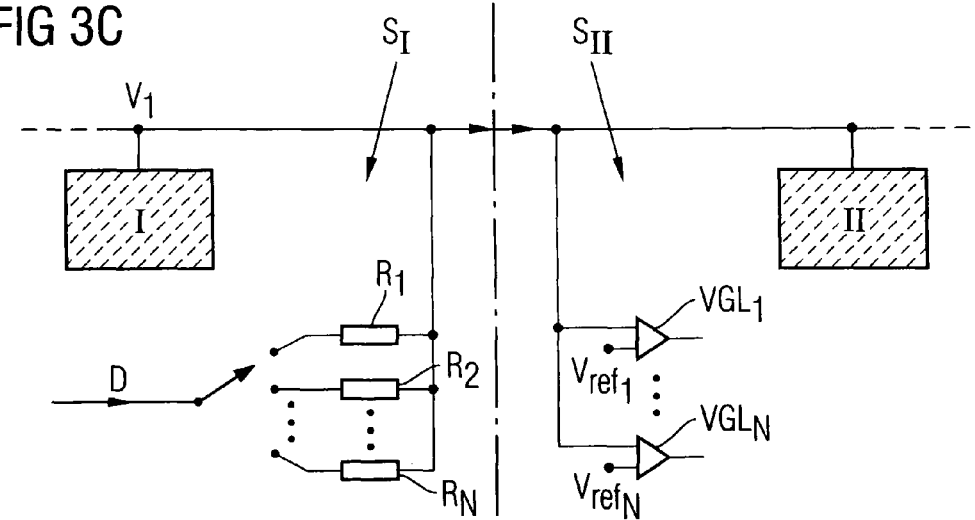

In the text which follows, three different circuit variants for transmitting/receiving interfaces for a signal transmission arrangement via a power supply line between, for example, two semiconductor chips I and II are described by means of FIGS. 3A, 3B and 3C, the signal transmission arrangements and the transmitting/receiving interfaces of FIGS. 3A and 3B being designed for bi-directional signal transmission and those of FIG. 3C being designed for unidirectional signal transmission.

According to FIG. 3A, the signals D (data) to be transmitted are inductively (for example with the aid of a signal transformer) coupled onto a power supply line V1, or coupled out of the power supply line, by a first transmitting/receiving interface SI on the side of a first semiconductor chip I. A second transmitting/receiving interface SII is located at the other chip end of the power supply line V1, where the latter is coupled to a second semiconductor chip II. In principle, the second transmitting/receiving interface SII is identical to the first transmitting/receiving interface SI and here, too, inductively couples the signals to be transmitted onto/from the power supply line V1 respectively. The respective double arrows D specify the abovementioned bi-directional signal transmission in FIG. 3A.

The exemplary embodiment shown in FIG. 3B is also designed for bi-directional signal transmission of signals D via a power supply line V1 which connects a first semiconductor chip I and a second semiconductor chip II. For this purpose, the signals D to be transmitted are coupled onto the power supply line V1, or are coupled out of the latter, via a high-pass filter HPF in a first transmitting/receiving interface SI on the side of the first semiconductor chip I. The design of the high-pass filter HPF must take into consideration the frequency characteristics of the transmitted signals D. An optional low-pass filter which passes direct currents and blocks alternating currents in a frequency band corresponding to the frequency band of the transmitted signals D is drawn dashed in the power supply line V1. Here, too, the transmitting/receiving interface SII provided on the side of the second semiconductor chip II is, identical to the first transmitting/receiving interface SI, in principle, which is why the signal transmission arrangement shown in FIG. 3B is also set up symmetrically and for a bi-directional transmission of the signals D via the power supply line V1 (see double arrows D).

In contrast, the third exemplary embodiment shown in FIG. 3C is asymmetric with regard to the design of the transmitting/receiving interface SI and SII in each case on the side of the first semiconductor chip I and of the second semiconductor chip II. The first transmitting/receiving interface SI has a controllable impedance device so that in each case an impedance R1, R2 and RN, allocated to a data item of the signals D to be transmitted, is applied to the power supply line VI. In contrast, the second transmitting/receiving interface SII on the side of the second semiconductor chip II has a comparator arrangement of a number of comparators VGL1, . . . , VGLN which in each case detect a small voltage change on the power supply line V1 by comparison with a reference voltage Vref1, . . . , VrefN selected in each case.

Naturally, the signal transmissions of the signal transmission arrangements according to the invention can be performed asynchronously or synchronously. For a synchronous signal transmission, a clock signal must also be transmitted, if necessary, between the semiconductor chips connected by the power supply line, or the clock signal must be regenerated from the transmitted signals.

The signal transmission arrangement described before and explained by means of the figures, and the signal transmission method according to the invention, utilize the power supply connections between a number of semiconductor chips, connected to one another, in particular, in a package, for the signal transmission between the chips and, as a result, reduce the number of physical connections between the semiconductor chips and the chip area necessary for these connections and the associated interface circuits. The invention can also be applied in arrangements in which the chips are not jointly packaged, but have separate packages, but are located closely next to one another.

LIST OF REFERENCE DESIGNATIONS

I,II,III Semiconductor chips
V1,V2,Va1,Va2,Van,Vb1, Vb2,Vbk Power supply lines between the semiconductor chips
SI,SII Transmitting/receiving interface
D Transmitted signals
HPF High-pass filter
TPF Low-pass filter
R1,R2,RN Impedances
VGL1,VGLN Comparators
Vref1,VrefN Reference voltages

The invention claimed is:

1. A signal transmission arrangement for the transmission of data signals between semiconductor chips, the signal transmission arrangement comprising:
at least one power supply connection connecting a plurality of semiconductor chips to one other, the plurality of semiconductor chips being connected to one another in a common chip package; and
a plurality of transmitting/receiving interfaces, each of the plurality of transmitting/receiving interfaces arranged at a chip end of the at least one power supply connection;
wherein the transmitting/receiving interfaces are configured to transmit the data signals via the at least one power supply connection, wherein the data signals are inductively, capacitively or resistively coupled onto the power supply connection.

2. The signal transmission arrangement of claim 1, wherein the plurality of semiconductor chips comprise a master chip and a slave chip, and wherein the signal transmission arrangement is configured for signal transmission between the master chip and the slave chip.

3. The signal transmission arrangement of claim 1, wherein the plurality of semiconductor chips comprise a plurality of functionally equivalent semiconductor chips, and wherein the signal transmission arrangement is configured for signal transmission between the plurality of functionally equivalent semiconductor chips.

4. The signal transmission arrangement of claim 1, wherein the plurality of transmitting/receiving interfaces are configured for serial signal transmission.

5. The signal transmission arrangement of claim 1, wherein the plurality of transmitting/receiving interfaces are configured for signal transmission over a number of parallel channels while simultaneously using a corresponding number of power supply connections between the plurality of semiconductor chips.

6. The signal transmission arrangement of claim 1, wherein the plurality of transmitting/receiving interfaces are configured for differential signal transmission via two power supply connections with isolated potentials.

7. The signal transmission arrangement of claim 1, wherein the plurality of transmitting/receiving interfaces are configured for bi-directional signal transmission via the at least one power supply connection.

8. The signal transmission arrangement of claim 1, wherein the plurality of transmitting/receiving interfaces include at least one transmission circuit operable to trigger small voltage fluctuations on the at least one power supply connection which correspond to the data signals to be transmitted.

9. The signal transmission arrangement of claim 8, wherein the plurality of transmitting/receiving interfaces include at least one receiver circuit operable to distinguish small voltage fluctuations on the at least one power supply connection as the transmitted data signals.

10. A method for transmitting data signals between semiconductor chips, the method comprising:
a) providing a plurality of transmitting/receiving interfaces, each of the plurality of transmitting/receiving interfaces arranged at a chip end of at least one power supply connection which connects a plurality of semiconductor, the plurality of semiconductor chips being connected to one another in a common chip package; and
b) transmitting the data signals using the transmitting/receiving interfaces via the at least one power supply connection, wherein the data signals are inductively, capacitively or resistively coupled onto the power supply connection.

11. The method of claim 10, wherein the plurality of semiconductor chips comprise a master chip and at least one slave chip, and wherein the step of transmitting the data signals comprises transmitting the data signals between the master chip and the at least one slave chip.

12. The method of claim 10, wherein the plurality of semiconductor chips comprise a plurality of functionally equivalent chips, and wherein the step of transmitting the data signals comprises transmitting the data signals between the number of functionally equivalent semiconductor chips.

13. The method of claim 10, wherein the plurality of transmitting/receiving interfaces are configured for serial signal transmission, and wherein the step of transmitting the data signals comprises a serial signal transmission.

14. The method of claim 10 wherein the plurality of transmitting/receiving interfaces are configured for a signal transmission via a number of parallel channels while simultaneously using a corresponding number of power supply connections between the plurality of semiconductor chips.

15. The method of claim 10 wherein the plurality of transmitting/receiving interfaces are configured for differential signal transmission via two power supply connections with isolated potentials.

16. The method of claim 10 wherein the plurality of transmitting/receiving interfaces are configured for bi-directional signal transmission via the at least one power supply connection.

17. The method of claim 10 wherein at least one of the plurality of transmitting/receiving interfaces is operable to trigger small voltage fluctuations on the at least one power supply connection which correspond to the signals to be transmitted.

18. The method of claim 17 wherein at least one of the plurality of transmitting/receiving interfaces is operable to distinguish small voltage fluctuations on the power supply connection as the transmitted signals.

19. The signal transmission method of claim 10 wherein the at least one power supply connection comprises a power supply line.

20. A method for transmitting data signals between semiconductor chips, the method comprising:
   a) providing at least one signal transmitter connected to at least one power supply line, the at least one signal transmitter associated with a first of a plurality of semiconductor chips, the plurality of semiconductor chips being connected to one another in a common chip package;
   b) providing at least one signal receiver connected to the at least one power supply line, the at least one signal receiver associated with a second of the plurality of semiconductor chips; and
   c) transmitting the data signals via the at least one power supply line from the at least one signal transmitter to the at least one signal receiver, wherein the data signals are inductively, capacitively or resistively coupled onto the at least one power supply line.

* * * * *